United States Patent
Koh

(10) Patent No.: US 7,118,938 B2
(45) Date of Patent: Oct. 10, 2006

(54) METHOD FOR PACKAGING A MULTI-CHIP MODULE OF A SEMICONDUCTOR DEVICE

(75) Inventor: Kyung Hee Koh, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/751,200

(22) Filed: Dec. 30, 2003

(65) Prior Publication Data

US 2004/0157374 A1    Aug. 12, 2004

(30) Foreign Application Priority Data

Dec. 30, 2002    (KR) ............... 10-2002-0086243

(51) Int. Cl.
*H01L 21/44*    (2006.01)
*H01L 21/48*    (2006.01)
*H01L 21/50*    (2006.01)

(52) U.S. Cl. .............. 438/106; 438/109; 438/110; 438/614; 438/666

(58) Field of Classification Search .............. 438/106, 438/107, 614, 618, 110, 109, 666, 617
See application file for complete search history.

(56) References Cited

U.S. PATENT DOCUMENTS

| | | | | |
|---|---|---|---|---|
| 5,492,235 A | * | 2/1996 | Crafts et al. ............... | 438/695 |
| 6,300,679 B1 | * | 10/2001 | Mukerji et al. ............. | 257/738 |
| 6,737,300 B1 | * | 5/2004 | Ding et al. ................. | 438/110 |
| 2002/0164838 A1 | * | 11/2002 | Moon et al. ................ | 438/107 |

* cited by examiner

*Primary Examiner*—Chuong Anh Luu
(74) *Attorney, Agent, or Firm*—Andrew D. Fortney

(57) ABSTRACT

A method for packaging a multi-chip module includes the steps of: connecting connection terminals of a tape of an anisotropic conductive adhesive film, on which a circuit is patterned to bond pads of the chip by applying an adhesive on the tape, applying an adhesive on an upper surface of the chip, folding the tape and attaching the folded tape to the upper surface of the chip and forming a plurality of ball terminals on a lower surface of the tape, the ball terminals being electrically connected to the connection terminals of the tape. An individual chip scale package may be manufactured by repeating the above steps.

10 Claims, 2 Drawing Sheets

METHOD FOR PACKAGING A MULTI-CHIP MODULE OF A SEMICONDUCTOR DEVICE

FIELD OF THE INVENTION

The present invention relates to a method for packaging a multi-chip module of a semiconductor device; and, more particularly, to a method for packaging a multi-chip module of a semiconductor device to realize a chip scale package for a surface mount package module by using a tape of an anisotropic conductive adhesive film on which a circuit is patterned.

BACKGROUND OF THE INVENTION

A semiconductor packaging technology for protecting a chip formed on a silicon wafer from external environment and connecting the chip to circuit components and a substrate has been developed remarkably. Recently, an insert mount package such as a dual in-line package (DIP) is nearly unused, but other surface mount packages such as a small outline package (SOP), a quad flat package (QFP), a thin small outline package (TSOP) and a paper thin package (PTP) are prevalently used as a semiconductor packaging technology.

Meanwhile, semiconductor devices have a tendency toward miniaturization and large integration; and, as a result, a packaging technique to modularize the surface mount package is continuously investigated.

However, there exists a difficulty in realizing miniaturization and large integration of the surface mount package module. Therefore, a chip scale package is required, in which a package miniaturized to have almost the same dimensions as a chip to be mounted therein.

SUMMARY OF THE INVENTION

It is, therefore, an object of the present invention to provide a method for packaging a multi-chip module of a semiconductor device to realize a chip scale package for a surface mount package module by using a tape of an anisotropic conductive adhesive film on which a circuit is patterned.

In accordance with the present invention, there is provided a method for packaging a multi-chip module, including the steps of: (a) connecting connection terminals of a tape of an anisotropic conductive adhesive film, on which a circuit is patterned to bond pads of the chip by applying an adhesive on the tape; (b) applying an adhesive on an upper surface of the chip, folding the tape and attaching the folded tape to the upper surface of the chip; (c) forming a plurality of ball terminals on a lower surface of the tape, the ball terminals being electrically connected to the connection terminals of the tape; (d) manufacturing a plurality of individual chip scale packages by repeating the steps (a) to (c); and (e) laminating the individual chip scale packages, wherein the ball terminals of an upper individual chip scale package is electrically connected to the circuit patterned on the tape which covers a lower individual chip scale package.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

A preferred embodiment of the present invention will now be described in detail with reference to the accompanying drawings.

With reference to FIGS. 1 to 5, a packaging process of a multi-chip module in accordance with the present invention is performed as follows.

Figure 1:
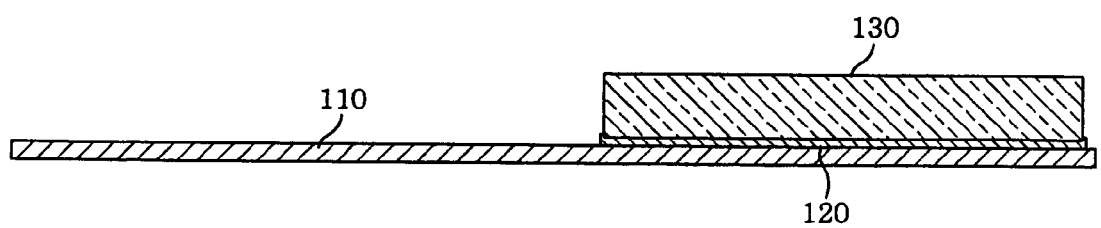
FIGS. 1 to 5 illustrate cross sectional views of a multi-chip module fabricated in accordance with the present invention.

As shown in FIG. 1, a tape 110 of an anisotropic conductive adhesive film is manufactured by patterning a circuit thereon. Thereafter, an anisotropic conductive adhesive 120 is applied on the tape 110 and then connection terminals of a circuit formed on the tape 110 is connected to bond pads of a chip 130 by using a C4 (controlled collapse chip connection) process.

The anisotropic conductive adhesive film, which has only z-directional conductivity (but not a x-directional and y-directional conductivity), functions as an adhesive. Moreover, in case of being connected with the bond pads of the chip 130, the anisotropic conductive adhesive film performs a function for transmitting an electric signal to an external part through communicating an anisotropic conductive material contained therein.

Although the C4 process is a similar technology as a flip chip process, the C4 process does not require an underfill process used in the flip chip process. Further, in the C4 process, the anisotropic conductive adhesive film functions as an adhesive, an underfill and an electrical connection terminal. Furthermore, although the flip chip process needs a large power, a large force and a high accuracy so as to electrically connect connection terminals with each other, the C4 process does not need such a large power, a large force and a high accuracy since it employs the anisotropic conductive adhesive.

Figure 2:
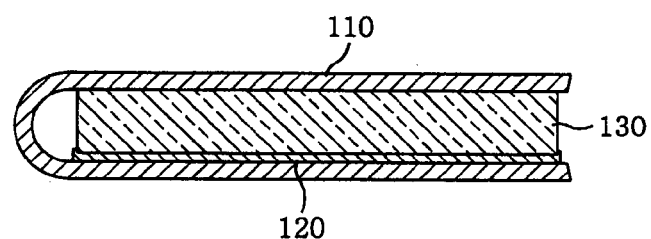

As shown in FIG. 2, a thermal conductive adhesive is then applied on an upper surface of the chip 130. Subsequently, the tape 110 is folded and an upper part thereof is attached to the upper surface of the chip 130.

Figure 3:
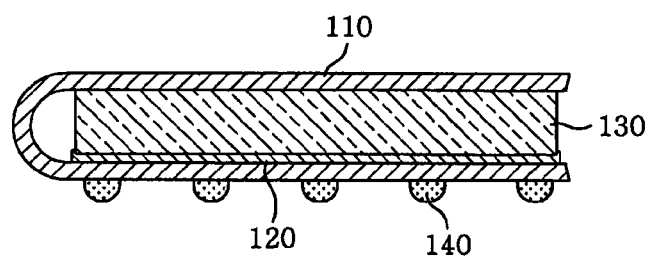

Thereafter, as shown in FIG. 3, a plurality of ball terminals are formed at a lower surface of the tape 110 such that the ball terminals are electrically connected to the connection terminals of the tape 110. In this way, an individual chip scale package for the multi-chip module is completed.

Then, by repeating a process of manufacturing the individual chip scale package for the multi-chip module, the individual chip scale packages as required are manufactured.

Figure 4:
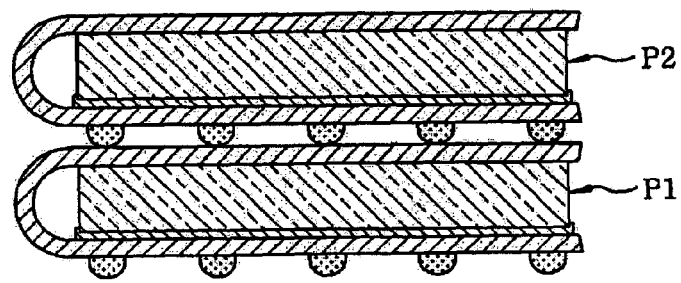
Figure 5:
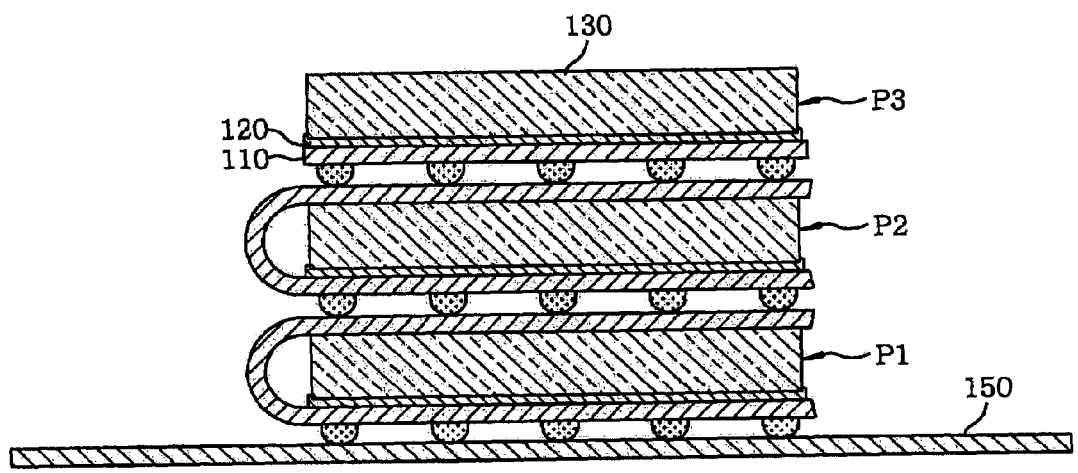

Referring to FIGS. 4 and 5, for example a second individual chip scale package (P2) may be laminated on an upper surface of a first individual chip scale package (P1) and then a third individual chip scale package (P3) may be laminated on an upper surface of the second individual chip scale package (P2). Such a laminating process may be repeated as required. In this case, an upper individual chip scale package is electrically connected with a lower individual chip scale package by contacting the ball terminals 140 of the upper individual chip scale package to the patterned circuit formed on the tape 110 which covers the lower individual chip scale package. In this way, one multi-chip module is completed.

Finally, the ball terminal 140 of the lowest individual chip scale package is electrically connected to a PCB (printed circuit board) substrate or other patterned circuit.

Meanwhile, when manufacturing the uppermost individual chip scale package (P3), the tape 110 may not cover an upper surface of the chip 130 as shown in FIG. 5. Therefore, it is preferable that the tape 110 covers only a lower surface of the uppermost chip 130.

As mentioned above, in accordance with the present invention, a chip scale package for a surface mount package module can be realized by using a tape of an anisotropic conductive adhesive film, on which the circuit is patterned. Further, heat generated during the operation of the chip can be easily dissipated through the thermal conductive adhesive.

Further, in accordance with the present invention, the anisotropic conductive adhesive film is used, which results in an elimination of an underfill process which is generally used in manufacturing a chip scale package so as to prevent an inside of the chip from being oxidized and improve operational reliability of the chip. Furthermore, the C4 process capable of bonding all bond pads at once is applied. Therefore, a whole process is simplified to improve a yield thereof.

Furthermore, an internal lead can be implemented in a form of multi-pin and fine pitch. Still further, since the tape serves as an external lead, the chip can be mounted on a place which a user desires, and a bend wiring is also possible.

While the invention has been shown and described with respect to the preferred embodiments, it will be understood by those skilled in the art that various changes and modifications may be made without departing from the spirit and scope of the invention as defined in the following claims.

What is claimed is:

1. A method for packaging a multi-chip module, comprising the steps of:
    (a) connecting connection terminals of a tape of an anisotropic conductive adhesive film, on which a circuit is patterned to bond pads of a chip by applying a first anisotropic conductive adhesive on the tape and using a first C4 process;
    (b) applying an adhesive on an upper surface of the chip, folding the tape and attaching the folded tape to the upper surface of the chip;
    (c) forming a plurality of ball terminals on a lower surface of the tape, the ball terminals being electrically connected to the connection terminals of the tape;
    (d) manufacturing a plurality of individual chip scale packages by repeating the steps (a) to (c); and
    (e) laminating the individual chip scale packages, wherein the ball terminals of an upper individual chip scale package are electrically connected to the circuit on an outer surface of the tape which covers a lower individual chip scale package.

2. The method of claim 1, further comprising the step of mounting the ball terminals of a lowest of the individual chip scale packages on a patterned circuit.

3. The method of claim 1, wherein, in the step (b), the adhesive comprises a second anisotropic conductive adhesive.

4. The method of claim 1, further comprising the step of providing an uppermost chip scale package on top of the laminated chip scale packages of step (e), wherein the tape covers only a lower surface of the uppermost individual chip scale package.

5. The method of claim 4, wherein the step of providing an uppermost chip scale package comprises connecting connection terminals of a further tape of a further anisotropic conductive adhesive film on which a further circuit is patterned to bond pads of a further chip by applying a second adhesive on the tape, and forming a further plurality at ball terminals on a lower surface of the further tape, the further plurality of ball terminals being electrically connected to the connection terminals of the further tape.

6. The method of claim 5, wherein the second adhesive comprises a third anisotropic conductive adhesive.

7. The method of claim 5, wherein the step of connecting the connection terminals of the further tape uses a second C4 process.

8. The method of claim 1, comprising the step of patterning the circuit on the tape.

9. The method of claim 1, wherein, in the step (b), the adhesive comprises a thermal conductive adhesive.

10. The method of claim 2, wherein the patterned circuit comprises a printed circuit board.

* * * * *